United States Patent [19]

Yanagihara

[11] Patent Number: 5,374,958
[45] Date of Patent: Dec. 20, 1994

[54] IMAGE COMPRESSION BASED ON PATTERN FINENESS AND EDGE PRESENCE

[75] Inventor: Haofumi Yanagihara, Tokyo, Japan

[73] Assignee: Sony Corporation, Tokyo, Japan

[21] Appl. No.: 81,196

[22] Filed: Jun. 25, 1993

[30] Foreign Application Priority Data

Jun. 30, 1992 [JP] Japan .................. 4-196220

[51] Int. Cl.⁵ ...................... H04N 7/130; H04N 7/133
[52] U.S. Cl. .................... 348/405; 348/421
[58] Field of Search ............... 358/133, 136; 348/405, 348/408, 420, 421; H04N 7/130, 7/133

[56] References Cited

U.S. PATENT DOCUMENTS

| | | | |
|---|---|---|---|
| 4,734,767 | 3/1988 | Kaneko et al. | 358/133 |
| 4,920,426 | 4/1990 | Hatori et al. | 358/133 |
| 5,047,852 | 9/1991 | Hanyu et al. | 348/408 |
| 5,073,821 | 12/1991 | Juri | 358/133 |
| 5,150,208 | 9/1992 | Otaka et al. | 358/133 |

FOREIGN PATENT DOCUMENTS 0239076 9/1987 European Pat. Off. .
0479510 4/1992 European Pat. Off. .

OTHER PUBLICATIONS

IEEE Military Communications Conference vol. 2, Oct. 20-23, 1985, Boston (MA) US, pp. 628-634; H. Magal et al.: 'Image Implementation'.
International Conference on EC-Energy, Computer, Communication and Control Systems, vol. 3, Aug. 28-30, 1992, New Delhi, IN, XP000333346, pp. 261-265; S. C. Kwatra et al.: 'Compressing the composite digital television signal by encoding the sub-bands'.
Patent Abstracts of Japan vol. 15, No. 269 (E-1087) 9 Jul. 1991 & JP-A-03 089 689 (Matsushita Electric Industry Co., Ltd.) 15 Apr. 1991.

Primary Examiner—Tommy P. Chin
Assistant Examiner—Richard Lee
Attorney, Agent, or Firm—William S. Frommer; Alvin Sinderbrand

[57] ABSTRACT

Alternating current coefficients in a block of orthogonal transform coefficients representing a digital image are quantized with a quantization step size selected with regard to whether the block represents motion or a still image, the fineness of the pictorial pattern in the image, the position of the coefficients in the block, and whether the coefficients represent luminance or chrominance information in the image. The fineness of the pictorial pattern is determined in accordance with the number of alternating current coefficients that exceed a first relatively small threshold value. If any of the alternating current coefficients exceed a second relatively large threshold value, the block is considered to have a high activity, that is, a fine pattern, and so is quantized with a large quantization step.

20 Claims, 11 Drawing Sheets

VIDEO → DCT → COEFFICIENTS (ALL 0)

VIDEO → DCT → COEFFICIENTS (ALL 0)

VIDEO → DCT → COEFFICIENTS

Fig. 6

| AREA Q No. | 0 | 1 | 2 | 3 | 4 | 5 | 6 | 7 |
|---|---|---|---|---|---|---|---|---|
| 0 | 1 | 1 | 1 | SQ | 2 | 2*SQ | 4 | 4*SQ |
| 1 | SQ | 2 | 2*SQ | 2*SQ | 4 | 4*SQ | 4*SQ | 4*SQ |
| 2 | 2 | 2*SQ | 2*SQ | 4 | 4*SQ | 4*SQ | 4*SQ | 8 |
| 3 | 2*SQ | 2*SQ | 4 | 4*SQ | 4*SQ | 4*SQ | 8 | 8 |
| 4 | 4 | 4 | 4*SQ | 4*SQ | 4*SQ | 8 | 8 | 8*SQ |
| 5 | 4 | 4*SQ | 4*SQ | 4*SQ | 8 | 8 | 8*SQ | 8*SQ |
| 6 | 4*SQ | 4*SQ | 4*SQ | 8 | 8 | 8*SQ | 8*SQ | 16 |
| 7 | 4*SQ | 4*SQ | 8 | 8 | 8*SQ | 8*SQ | 8*SQ | 16 |
| 8 | 8 | 8 | 8 | 8*SQ | 8*SQ | 8*SQ | 16 | 16 |
| 9 | 8 | 8 | 8*SQ | 8*SQ | 8*SQ | 16 | 16*SQ | 16*SQ |
| 10 | 8 | 8*SQ | 8*SQ | 8*SQ | 16 | 16*SQ | 16*SQ | 16*SQ |
| 11 | 8*SQ | 8*SQ | 8*SQ | 16 | 16*SQ | 16*SQ | 16*SQ | 32 |
| 12 | 8*SQ | 8*SQ | 16 | 16*SQ | 16*SQ | 16*SQ | 32 | 32*SQ |
| 13 | 8*SQ | 16 | 16*SQ | 16*SQ | 32 | 32 | 32*SQ | 32*SQ |
| 14 | 16 | 16*SQ | 32 | 32 | 32 | 32*SQ | 64 | 64 |
| 15 | 16*SQ | 32 | 32 | 32 | 32*SQ | 64 | 64 | 64 |

Fig. 9

| 1  | 3  | 4  | 10 | 11 | 21 | 22 | 36 |
|----|----|----|----|----|----|----|----|
| 6  | 8  | 13 | 19 | 24 | 34 | 38 | 49 |
| 15 | 17 | 26 | 32 | 40 | 47 | 51 | 58 |
| 28 | 30 | 42 | 45 | 53 | 56 | 60 | 63 |
| 2  | 5  | 9  | 12 | 20 | 23 | 35 | 37 |
| 7  | 14 | 18 | 25 | 33 | 39 | 48 | 50 |
| 16 | 27 | 31 | 41 | 46 | 52 | 57 | 59 |
| 29 | 43 | 44 | 54 | 55 | 61 | 62 | 64 |

Fig. 10

|   | 0 | 1 | 1 | 2 | 3 | 4 | 5 |
|---|---|---|---|---|---|---|---|
| 1 | 1 | 2 | 3 | 4 | 5 | 6 | 6 |
| 2 | 3 | 4 | 5 | 6 | 6 | 7 | 7 |
| 4 | 5 | 5 | 6 | 6 | 7 | 7 | 7 |
| 0 | 0 | 1 | 1 | 2 | 3 | 4 | 5 |
| 1 | 1 | 2 | 3 | 4 | 5 | 6 | 6 |
| 2 | 3 | 4 | 5 | 6 | 6 | 7 | 7 |
| 4 | 5 | 5 | 6 | 6 | 7 | 7 | 7 |

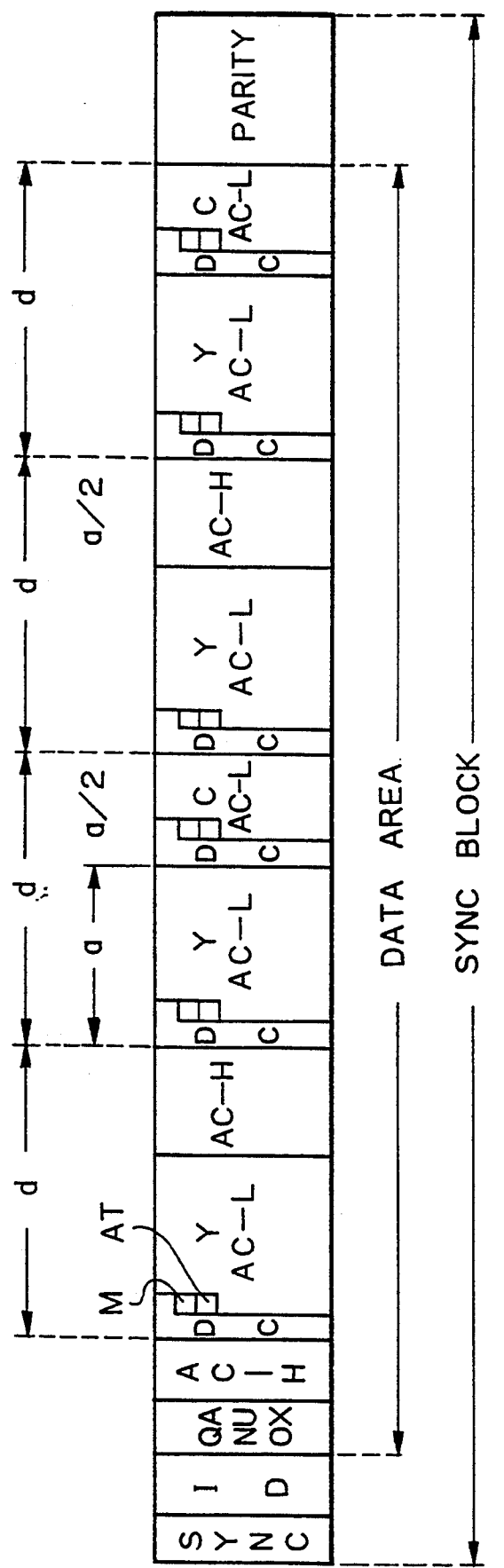

IMAGE COMPRESSION BASED ON PATTERN FINENESS AND EDGE PRESENCE

BACKGROUND OF THE INVENTION

The present invention relates to compression and transmission of a digital image signal using an orthogonal transformation process and quantization of the thus-obtained transform coefficients to produce compressed data.

A digital VTR which records a digital video signal on a magnetic tape with, for example, rotary heads, typically compresses the digital data using a highly efficient coding technique before recording the data. One such coding technique is a discrete cosine transformation (DCT), in which one frame of an image is converted into blocks of, for example, (8×8) elements. Each of the image data blocks is then transformed into a block of (8×8) coefficient data which are compressed using a variable length code encoding process, such as a run length code encoding process followed by a Huffman code encoding process. The thus compressed data comprise a code signal which undergoes frame segmentation, that is, the code signal is placed into data areas of a predetermined number of sync blocks, and combined with a synchronization signal and an ID signal. The frame segmented signal is transmitted to the rotary heads for recording.

To control the amount of data recorded on one track to be a predetermined value, before the coefficient data are encoded with a variable length code, the coefficient data are quantized using a quantization step size chosen to produce a certain amount of quantized data. It is preferred that the data amount control, also referred to as the buffering process, consider the frequency distribution of the coefficient data and the effect of the quantization on the image quality of the reproduced image.

Specifically, high frequency transform coefficients are usually quantized with a large quantization step size, resulting in a coarsely quantized image, whereas low frequency transform coefficients are quantized with a small quantization step size, resulting in a finely quantized image. This procedure results in more quantization distortion in the high frequency components of a reproduced image than in its low frequency components, which is acceptable since quantization distortion in the high frequency components of an image is less noticeable than quantization distortion in the low frequency components of an image.

To reduce the quantization noise in the high frequency components, a method using both a round-off process and a truncation process has been proposed in which a round-off process is used when quantizing high frequency coefficients and a truncation process is used when quantizing low frequency coefficients. In this method, since the pictorial pattern of a block is considered, the deterioration in quality of a reproduced image can be prevented to some extent. However, the round-off process adversely affects the signal to noise (S/N) ratio of the reproduced signal.

Quantization distortion is less noticeable in a fine pictorial pattern than in a pattern representing an edge. A block with a fine pictorial pattern has high frequency components. However, if the high frequency components in a block represent an edge, then distortion due to quantization of the high frequency coefficient data is noticeable.

OBJECTS AND SUMMARY OF THE INVENTION

Therefore, an object of the present invention is to compress a digital image signal in a manner which avoids the aforementioned disadvantages of the prior art.

It is another object of the present invention to compress the high frequency coefficients representing an image block with less noticeable distortion.

It is yet another object of the present invention to compress a digital image signal in a manner which preserves information about edges in the image, thereby improving the perceived resolution in a decompressed image.

It is still another object of the present invention to compress the data representing the color of an image more than the data representing the luminance of an image, so that the distortion introduced by the compression is less noticeable.

In accordance with an aspect of this invention, a digital image signal is segmented into blocks of image data, which are orthogonally transformed into blocks of coefficient data having a direct current coefficient and a plurality of alternating current coefficients. The alternating current coefficients are quantized using a selected quantization step to generate quantized data, which are variable length code encoded. The quantization step is selected in accordance with an activity code generated by comparing the alternating current coefficients with a plurality of threshold values.

In accordance with another aspect of the present invention, a digital image signal is segmented into blocks of image data, which are orthogonally transformed into blocks of coefficient data having a direct current coefficient and a plurality of alternating current coefficients. The values of each of the alternating current coefficients are compared with a first threshold value to produce a detection flag. The values of a predetermined range of alternating current coefficients are compared with additional threshold values to produce a set of comparison results. An activity code is generated in accordance with the set of comparison results and the detection flag. The activity code corresponds to high activity when the detection flag indicates that the value of at least one of the alternating current coefficients exceeded the first threshold value. A quantization step is selected in accordance with the activity code. The alternating current coefficients are quantized using the selected quantization step to generate quantized data, which are variable length code encoded.

The above, and other objects, features and advantages of the present invention will be apparent in the following detailed description of the preferred embodiments of the present invention when read in conjunction with the accompanying drawings in which corresponding parts are identified by the same reference numeral.

BRIEF DESCRIPTION OF THE DRAWINGS

FIG. 6 is a table showing sets of quantization steps;

FIG. 9 is a diagram illustrating a scanning sequence for coefficients in a block of coefficients representing motion;

FIG. 10 is a diagram depicting area numbers for the coefficients in a block of coefficients representing motion;

FIG. 15 is a diagram illustrating the format of a sync block according to the present invention.

DETAILED DESCRIPTION OF THE PREFERRED EMBODIMENTS

In the present invention, a quantization step for a coefficient is selected as a function of whether the block to which the coefficient belongs represents a still image or an image containing motion, and as a function of the frequency which the coefficient represents.

The quantization step is also selected as a function of the fineness of the pictorial pattern of the image which the block represents. High frequency coefficients representing a fine pictorial pattern devoid of motion are quantized with a large quantization step size, so as to limit the amount of quantized high frequency coefficient data, thereby making more capacity of a fixed recording format available for low frequency coefficient data.

The quantization step is further selected as a function of whether the block represents an edge. If so, the block is quantized with a small quantization step size to prevent edge information from being lost by the quantization process.

Moreover, the quantization step is selected based on whether the coefficient represents luminance or chrominance (color) information in an image. Since coarse quantization of color information is less noticeable than coarse quantization of luminance information, the present invention uses an area shift process to more coarsely quantize the chrominance information, thereby making more capacity of a fixed recording format available for luminance information and improving the perceived resolution of a reproduced image.

Figure 1A:
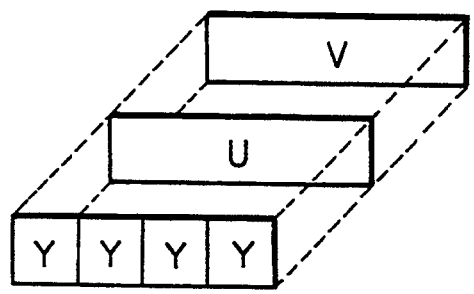
FIGS. 1A and 1B are schematic diagrams illustrating macro blocks according to different video transmission systems.

A macro block comprises a plurality of blocks, each of which is an (8 element × 8 row) arrangement of coefficient data. For example, in the case of video data according to the 525/60 component system having four blocks of luminance data Y for every two blocks of chrominance data U, V, that is, Y:U:V=4:1:1, as shown in FIG. 1A, four Y blocks, one U block, and one V block at the same position in one frame constitute one macro block. When the sampling frequency is 4 fsc (fsc is a color subcarrier frequency), one frame of an image comprises (910 samples × 525 lines). The viewable portion of this image is (720 samples × 480 lines). In this system, the total number of blocks in one frame is ((720 × 6/4) × 480)/(8 × 8) = 8100. The number of macro blocks in one frame is 8100/6 = 1350.

Figure 1B:
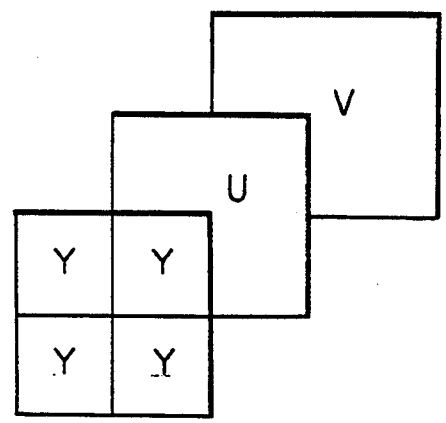

In the case of video data according to the 625/50 component system having luminance and chrominance data in the ratio shown in FIG. 1B, a total of six blocks comprising four Y blocks, one U block, and one V block at the same position in one frame constitute one macro block.

When the image data for a block represents a still image or a block containing only a small amount of motion, then the block is compressed using an in-frame process, described below.

Figure 2:
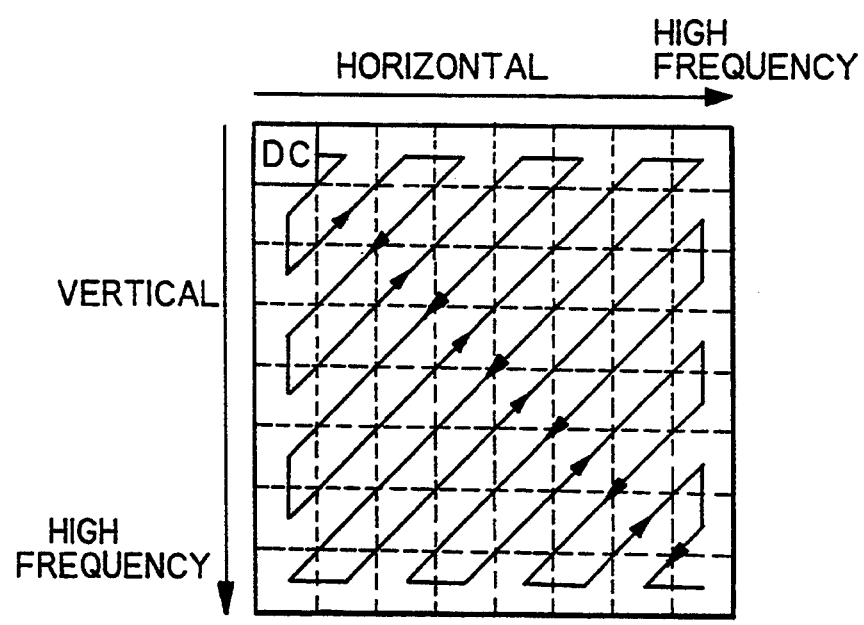
FIG. 2, is a diagram illustrating a scanning sequence for coefficients in a still image block.

As shown in FIG. 2, a block of coefficient data has a direct current (DC) coefficient in the upper left corner, and alternating current coefficients in all other positions. The (8×8) block represents the same position in two fields of a frame, that is, a (4×8) block from each of two fields. Odd numbered lines in the block correspond to pixel data for the first field, while even-numbered lines in the block correspond to pixel data for the second field. The alternating current coefficients are scanned in a zigzag sequence from low frequency alternating current components to high frequency alternating current components to form a coefficient signal.

To determine the quantization step size that should be used with a block of coefficient data, the present invention considers two aspects of the alternating current coefficient data in a block, namely, whether the coefficients represents an edge of an image and whether the coefficients represents a fine pictorial pattern. If the block represents an edge, then it should be finely quantized, that is, quantized using a small quantization step size, since quantization distortion in a reproduced edge is particularly noticeable. If the block represents a fine pictorial pattern, then it should be coarsely quantized, that is, quantized using a large quantization step size, since quantization distortion in a fine pictorial pattern is not particularly noticeable.

Figure 3A:
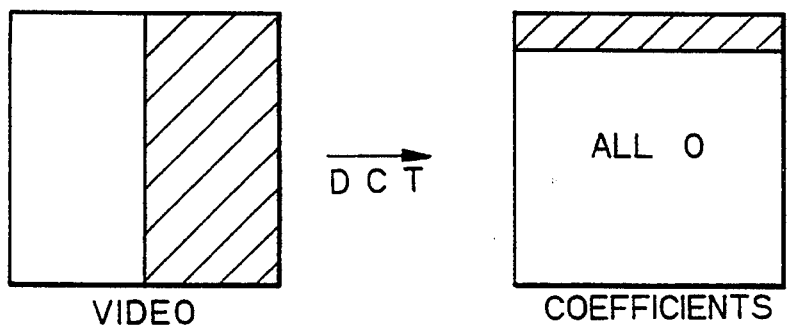
FIGS. 3A–3C illustrate how edges in an image are represented by coefficient data.
Figure 3B:
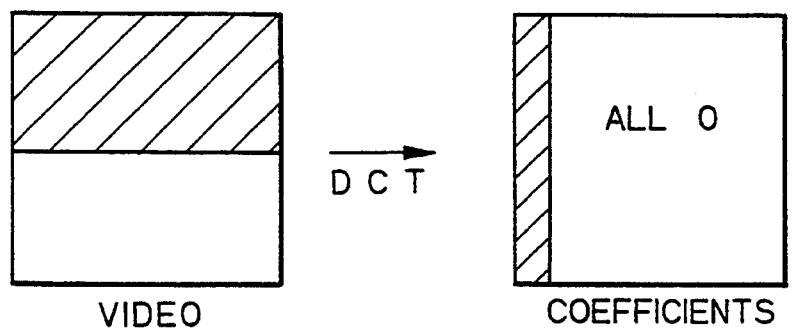
Figure 3C:
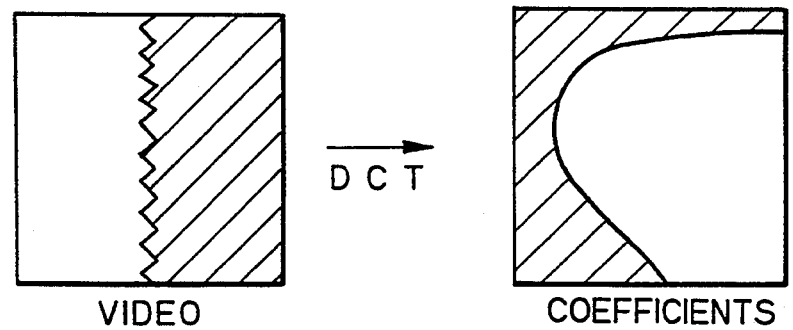

As shown in FIG. 3A, when a block which represents an edge in the vertical direction is DCT-transformed, coefficient data corresponding to the vertical edge are located only in the first row of the coefficient block. As shown in FIG. 3B, when a block which represents an edge in the horizontal direction is DCT-transformed, coefficient data corresponding to the horizontal edge are located only in the first column of the coefficient block. As shown in FIG. 3C, when an block representing an edge in the vertical direction has a small amount of motion and is DCT-transformed as if it were a still image, coefficient data are located in the first row and first column of the coefficient block, and also in the upper left and lower left corners of the block.

Thus, to determine whether a block represents a fine pictorial pattern, as distinguished from a vertical edge, a horizontal edge, or an edge with a small amount of motion, only the coefficients generally located in the lower right corner of a coefficient block are considered. Specifically, as shown in FIG. 4, the coefficients located in the lower right corner, indicated by shading, are used to detect the fineness of the pictorial pattern in a block, referred to herein as the activity code or class of the block.

Figures 4, 5:
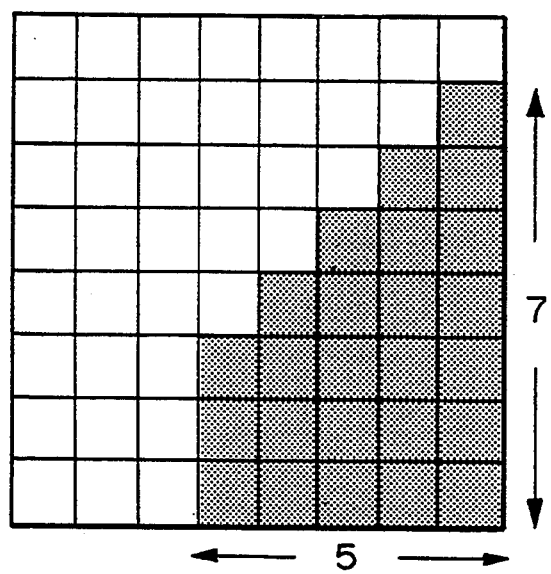
FIG. 4 is a diagram depicting an activity detection area in a block of coefficient data.
FIG. 5 is a diagram depicting area numbers for the coefficients in a still image block.

More specifically, the absolute value of each of the coefficients located in the shaded area of a coefficient block, as shown in FIG. 4, are compared to a first threshold value TH1 to obtain the number of coefficients NH in the shaded area having an absolute value exceeding the first threshold TH1. The higher the value of NH, the finer is the pictorial pattern represented by the block.

Additionally, the activity code for a block depends on whether any coefficients exceed a predetermined magnitude, since the range of coefficient values is restricted in a Huffman table used in the variable length coding process, discussed in detail below. Specifically, the absolute value of each of the alternating current coefficients in the entire coefficient block, are compared to a second threshold value TH2 to determine whether any of these alternating current coefficients exceed the second threshold TH2. If any alternating current coefficients exceed the second threshold TH2, then a flag NF is set to one. Otherwise, the flag NF has a value of zero.

The activity code AT, also referred to herein as the activity class, of a block is defined in Table 1.

TABLE 1

| NF | NH | ACTIVITY CLASS |
|---|---|---|
| 0 | 0 | 0 (AT = 00) |
| 0 | 1-4 | 1 (AT = 01) |
| 0 | 5-9 | 2 (AT = 10) |
| 0 | ≧10 | 3 (AT = 11) |
| 1 | ALL | 3 (AT = 11) |

The class 0 represents the lowest activity, the class 1 represents the second lowest activity, the class 2 represents the second highest activity, and the class 3 represents the highest activity. The quantization step size used for a block is proportional to its activity code, that is, a block having an activity class of 0 is finely quantized, while a block having an activity class of 3 is coarsely quantized.

The present invention quantizes low frequency coefficients with a relatively small quantization step size, and quantizes high frequency coefficients with a relatively large quantization step size. More specifically, the alternating current coefficients in a block are classified by an area number, with the area number being generally proportional to the frequency of the coefficients, that is, a higher area number indicates a higher frequency coefficient. The reason coefficients are divided into areas is because coefficients having higher frequencies can be more coarsely quantized with less effect on the quality of restored image than coefficients having lower frequencies.

FIG. 5 shows each of the coefficients in a block and its corresponding area number, chosen from area numbers 0 ... 7. A set of eight quantization step sizes is used during quantization of the coefficients, one step size per area number. As explained in detail below, for each coefficient, its position in a block determines its area number, which in turn determines the step size selected from the set of quantization step sizes which is used to quantize the coefficient.

The present invention adjusts the quantization step size q for a coefficient depending on its activity class. The adjusted quantization step size is the original step size plus a quantization step size adjustment equal to the activity class minus one, AT−1. Thus, for a coefficient having an activity code of 0, its quantization step size is decreased to q−1 so that the resolution of the corresponding image is increased. For a coefficient having an activity code of 3, its quantization step size is increased to q+2 so that the resolution of the corresponding image is relatively coarse.

Generally, deterioration in the resolution of color signals is less noticeable than deterioration in the resolution of luminance signals. To take advantage of this fact, the present invention shifts, that is, increases, the area number of coefficients representing chrominance information in a process referred to herein as an area shift process. Coefficients representing luminance information are not area shifted. The result is a reduction in the amount of information used to represent chrominance information, which makes additional capacity in a fixed size recording format available for representing luminance information. This is advantageous as a decompressed signal according to the present invention appears to have improved resolution.

More specifically, as shown in Table 2, the area shift process is not performed on coefficients representing the luminance signal. For the chrominance signals U, V, the area shift is a function of the activity class of the coefficient. The area shift values in Table 2 are added to the original area numbers. When the shifted area number exceeds the maximum area number, 7, the shifted area number is set to the maximum area number. Table 2 also shows the quantization step size adjustment for a coefficient as a function of its activity code.

TABLE 2

| ACTIVITY CLASS | 0 | 1 | 2 | 3 |
|---|---|---|---|---|
| Y | | | | |
| Q STEP SIZE ADJ | q − 1 | q | q + 1 | q + 2 |
| AREA SHIFT | N/A | N/A | N/A | N/A |
| U, V | | | | |
| Q STEP SIZE ADJ | q − 1 | q | q + 1 | q + 2 |
| AREA SHIFT | 2 | 2 | 3 | 0 |

To control the total amount of compressed data representing an image, the present invention uses a plurality of sets of quantization step sizes, as shown in FIG. 6. In FIG. 6, SQ represents an approximated value of the square root of two, namely, $1 + \frac{1}{4} + \frac{1}{8} + 1/32 = 1.40625$. The sixteen sets of quantization steps are identified by quantization set numbers 0 ... 15. In FIG. 6, one row corresponds to one set of quantization step sizes. Each set consists of eight quantization step sizes corresponding to each of the area numbers 0 to 7. For example, the quantization set number 0 consists of the following quantization step sizes:

(1 1 1 SQ 2 2-SQ 4 4-SQ)

The quantization set number is proportional to the quantization step size. In other words, the larger the quantization set number, the more coarsely are the coefficients quantized. Since all quantization step sizes have a value which is a power of 2, a simple division circuit can be used as a quantizer.

Figure 7A:
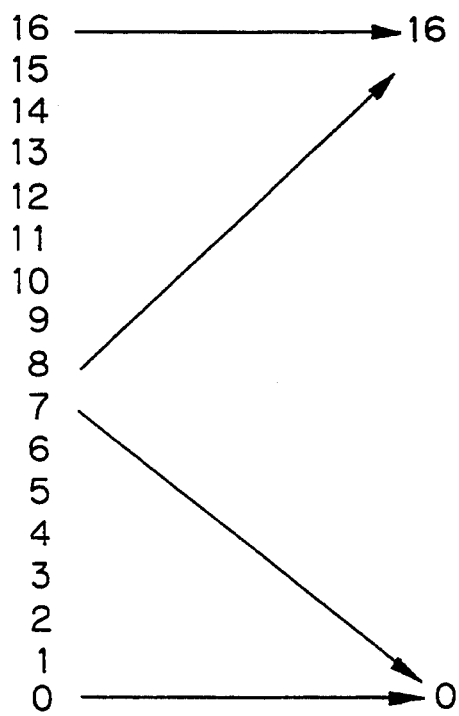
FIGS. 7A and 7B illustrate mapping processes used in a typical quantization operation and a quantization operation according to the present invention, respectively.

Quantization involves mapping ranges of value to a set of quantization step values. Typically, the ranges are centered about the quantization step values. FIG. 7A shows a typical method of quantizing. In FIG. 7A, there are seventeen values 0 ... 16 mapped to two quantized values 0, 16. The midpoint of the quantized values is $(0+16)/2 = 8$. All values less than the midpoint are mapped to the lower quantized value 0, while all values greater than or equal to the midpoint are mapped to the upper quantized value 16. More generally, the coefficient data C are divided by a quantization step D and the result is truncated to a quantized number Q(C) according to the following equation:

$$Q(C) = INT[\{C+(D/2)\}/D]$$

This type of quantization results in a mathematical minimization of the distortion due to quantization. However, this type of quantization does not necessarily minimize visual distortion in a reproduced image.

Normally, the high frequency components representing an image have small values. Using a midpoint-type mapping during quantization causes the small values of the high frequency components to be mapped to a value of zero, which improves the efficiency of a subsequent variable length code encoding process. However, if the image has a pictorial pattern in which high frequency coefficients with large values are present, then during a typical quantization operation, the values of the high frequency components are mapped to a larger number, namely, the upper quantized value 16. In other words, during a typical quantization operation, the high frequency coefficients of large value are amplified. Thus, the mapping introduces a noticeable distortion into a reproduced image, resulting in a perception of degraded image quality.

The present invention uses a special type of quantization, namely, a mapping which minimizes visual distortion.

In the present invention, low frequency coefficients, that is, coefficients having an area number less than four, are quantized using a conventional midpoint-type mapping, as described above.

However, in the present invention, high frequency coefficients, that is, coefficients having an area number of four or greater, are quantized using a mapping which maps fewer values to the upper quantization value when the quantization step size is large. For example, a special quantization mapping, also referred to herein as a truncation, is given by the following equation:

$$Q(C) = INT[\{C + (D/2)\}/D], D < 8$$
$$= INT[\{C + INT(D/3)\}/D], D \geq 8$$

Figure 7B:
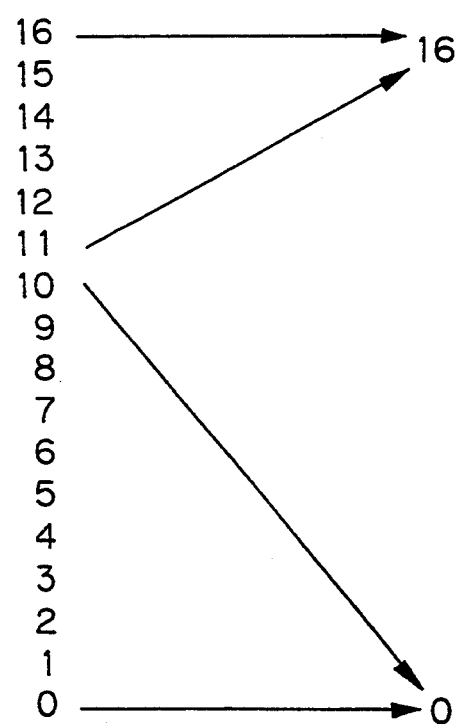

When the value of the quantization step size is less than 8, the normal mapping process is performed. When the value of the quantization step size is 8 or more, the special mapping process shown in FIG. 7B is performed, in which a quantized coefficient is mapped to a lower quantized value when the quotient of dividing the coefficient by the quantization step has a fractional value less than two-thirds of the value of the quantization step. With this special type of quantization mapping, when the quantization step size is large, noticeable quantization distortion is reduced. Since the typical mapping is used when the activity class of the block is low and when the quantization step size is not large, the S/N ratio of the reproduced signal is properly maintained.

For example, the normal mapping process is used in quantizing coefficients in all areas when the quantization set number 0, shown in FIG. 6, is selected. When the quantization set number 5 is selected, the normal mapping process is used in quantizing coefficients in areas 0-3, and the special mapping process is used in quantizing coefficients in areas 4-7. When the quantization set number 10 is selected, the special mapping process is used in quantizing coefficients in all areas.

When the image data for a block represents motion, the block is compressed using an in-field process which differs from the in-frame process used to compress a still image, as described below.

Figure 8:
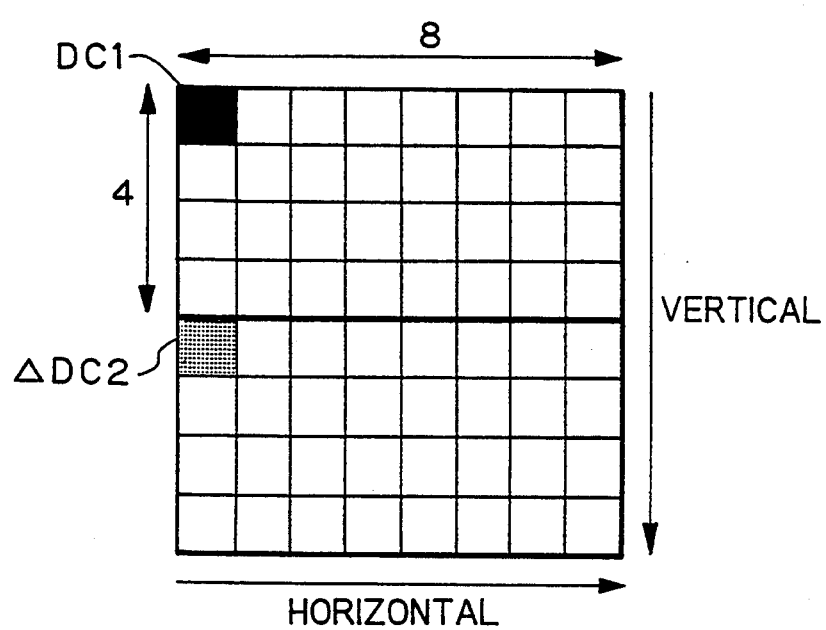
FIG. 8 is a diagram showing the formation of a block of coefficient data representing motion.

In the case of the in-field DCT process, (4×8) coefficient data for a first field and (4×8) coefficient data for a second field are generated. The coefficient data of the first field and that of the second field become an upper and a lower part, respectively, of an (8×8) array as shown in FIG. 8. The coefficient data for the first field contains a direct current component DC1. Likewise, the coefficient data for the second field contains a direct current component DC2.

To avoid an increase in the hardware size of a compression circuit, it is desirable to use the same hardware for compressing both still image coefficients and motion coefficients, despite the differing composition of the (8×8) coefficient blocks in these cases. Consequently, in the present embodiment, a difference direct current component for the second field $\Delta DC2 = (DC1-DC2)$ is used in place of the direct current component DC2 for the second field.

Except when a scene change takes place between fields, the first and second fields represented in a motion block are usually correlated, that is, the value of the difference direct current component is usually very close to 0. Thus, use of the difference direct current component prevents coarse quantization of coefficients in the block. Use of the difference direct current component also reduces the quantization distortion.

A motion block is considered as having an activity code AT of 0, that is, it must be finely quantized so as to exhibit high resolution.

For a motion block, the scanning sequence shown in FIG. 9 is used, instead of the scanning sequence shown in FIG. 2, to maximize the length of a run of coefficients having a value of zero which improves the efficiency of the variable length code encoding process.

For a motion block, the area number definition shown in FIG. 10 is used instead of the area number definition shown in FIG. 5, in consideration of the manner in which the block is formed.

Examples of determining a quantization step will now be provided for a coefficient located, for example, in the left column and next to bottom row of a block of coefficient data. The examples are for the cases where the coefficient represents luminance data for a still image, chrominance data for a still image, luminance data for a motion image, and chrominance data for a motion image.

The activity code for the coefficient is obtained. For a still image, the activity code is determined in accordance with Table 1. As an example, assume the still image block has no coefficients which exceed the threshold TH2, and seven coefficients which exceed the threshold TH1. The activity code AT for this still image block is 2. For a motion block, the activity code AT is always 0.

The area number for the coefficient is obtained. For a still image, FIG. 5 is used, with the result that the area number is 3. For a motion image, FIG. 10 is used, with the result that the area number is 2. The examples are, at this point:

|  | STILL IMAGE BLOCK | | MOTION BLOCK | |
|---|---|---|---|---|
|  | LUM Y | CHROM U, V | LUM Y | CHROM U, V |
| ACTIVITY CODE | 2 | 2 | 0 | 0 |
| AREA NUMBER | 3 | 3 | 2 | 2 |

The area shift process is performed in accordance with Table 2. The luminance data is unaffected. The area number of the chrominance coefficient for the still image block is shifted by 3, since the block has an activity class of 2. The area number of the chrominance coefficient for the motion block is shift by 2, since the motion block has an activity class of 0. The examples after the area shift process are:

|  | STILL IMAGE BLOCK | | MOTION BLOCK | |
|---|---|---|---|---|
|  | LUM Y | CHROM U, V | LUM Y | CHROM U, V |
| ACTIVITY CODE | 2 | 2 | 0 | 0 |
| AREA NUMBER | 3 | 6 | 2 | 4 |

An unadjusted quantization step q is obtained. The sets of quantization steps are shown in FIG. 6. Assume the quantization set number 5 is selected as it corresponds to the maximum amount of quantized data less than a predetermined amount, as explained in detail below. This set 5 comprises the following quantization steps:

| AREA NUMBER | 0 | 1, 2, 3 | 4, 5 | 6, 7 |
|---|---|---|---|---|
| q | 4 | 4*SQ | 8 | 8*SQ |

The area numbers of the luminance coefficients for the still image and motion blocks determine that the quantization step q in these examples is 4*SQ. The area number of the chrominance coefficient for the still image block is 6, so its quantization step is 8*SQ. The area number of the chrominance coefficient for the motion block is 4, so its quantization step is 8. At this point, the examples are as follows:

|  | STILL IMAGE BLOCK | | MOTION BLOCK | |
|---|---|---|---|---|
|  | LUM Y | CHROM U, V | LUM Y | CHROM U, V |
| ACTIVITY CODE | 2 | 2 | 0 | 0 |
| AREA NUMBER | 3 | 6 | 2 | 4 |
| q | 4*SQ | 8*SQ | 4*SQ | 8 |

The quantization step for the coefficient is adjusted based on the activity class of the block, in accordance with Table 2. The still image block has an activity class of 2, so its coefficients are adjusted to q+1. The motion block has an activity class of 0, so its coefficients are adjusted to q−1. At this point, the examples have become:

|  | STILL IMAGE BLOCK | | MOTION BLOCK | |
|---|---|---|---|---|
|  | LUM Y | CHROM U, V | LUM Y | CHROM U, V |
| ACTIVITY CODE | 2 | 2 | 0 | 0 |
| AREA NUMBER | 3 | 6 | 2 | 4 |
| q | 4*SQ + 1 = 6.625 | 8*SQ + 1 = 12.25 | 4*SQ − 1 = 4.625 | 8 − 1 = 7 |

The area numbers for the luminance coefficients in the still image block and the motion block are less than four, so these coefficients are not eligible for the special quantization mapping or truncation shown in FIG. 7B. The chrominance coefficient for the motion block is eligible for the special quantization mapping but its quantization step, as adjusted, has a value less than eight (D<8), so the normal midpoint mapping is performed during its quantization. The chrominance coefficient for the still image block has an area number of at least four, and its quantization step has a value greater than eight (D≧8), so the special mapping process illustrated in FIG. 7B is used during quantizing of this coefficient to reduce the noticeability of noise introduced by the quantizing operation.

Figure 11:
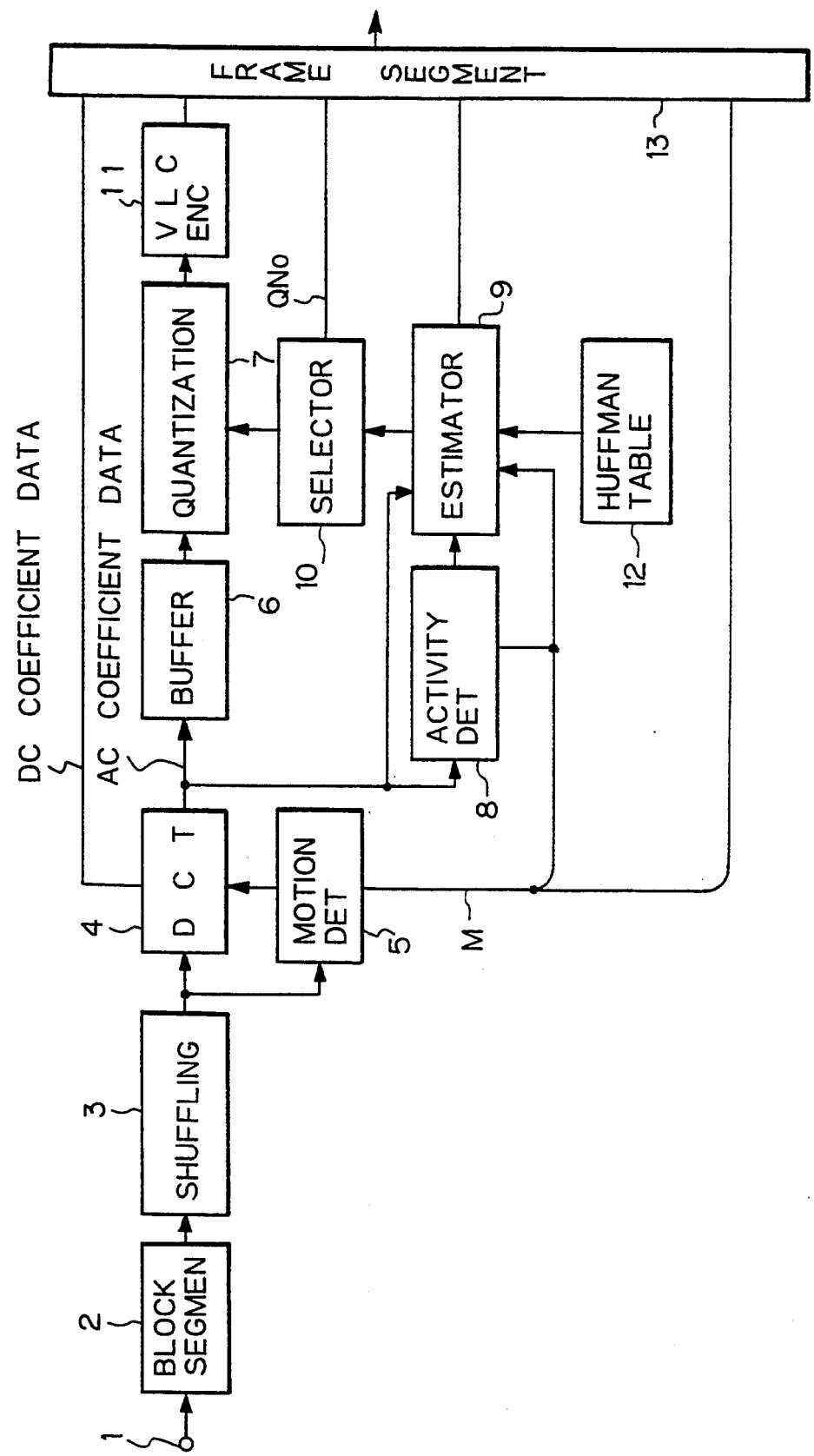
FIG. 11 is a block diagram showing a recording circuit for a digital VTR in which the present invention is applied.

FIG. 11 shows an embodiment of a digital image processing apparatus according to the present invention which is part of the recording system of a digital VTR. In FIG. 11, input terminal 1 is adapted to receive digitized video data, and to supply the digitized video data to a block segmentation circuit 2.

The block segmentation circuit 2 functions to segment video data in an interlace scanning sequence into an (8×8) block of image data. In other words, two (4×8) blocks which are present in the same position in first and second fields of a frame are formed into an (8×8) block. The block segmentation circuit 2 also functions to supply the blocked image data to a shuffling circuit 3 that serves to shuffle the spatial positions of a plurality of macro blocks of one frame so as to disperse errors due to drop-outs, tape scratches, head clogging, and so forth. Such dispersion reduces deterioration in the quality of a reproduced image. In this embodiment, the shuffling circuit 3 shuffles five macro blocks at a time. The shuffling circuit 3 supplies the shuffled macro blocks to a DCT circuit 4 and a motion detection circuit 5.

The DCT circuit 4 is adapted to generate (8×8) blocks of coefficient data, each block comprising a direct current component coefficient and alternating current component coefficients. The direct current components of the (8×8) coefficient data generated by the DCT circuit 4 are transmitted directly to a frame segmentation circuit 13 without compression. The alternating current components are compressed and then supplied to the frame segmentation circuit 13.

The motion detection circuit 5 functions to determine whether each block is a still image or a block containing motion. The motion detection circuit 5 performs a Hadamard transformation on the image data supplied thereto, and examines the transform coefficient data in the vertical direction of an (8×8) coefficient block. A Hadamard transformation is particularly effective in digitizing images with edges, and so is convenient to use. Alternatively, the motion of a block can be detected from the absolute value of the difference in data at the same position in successive fields. The motion detection circuit 5 also functions to supply a motion flag signal M to an activity detection circuit 8, an estimator 9 and the frame segmentation circuit 13.

The motion detection circuit 5 further functions to apply a control signal to the DCT circuit 4, to select an in-frame DCT process for a still image block and to select an in-field DCT process for a block representing motion.

In the in-frame DCT process, the DCT circuit 4 generates coefficient data for an (8×8) block representing two interleaved (4×8) blocks at the same position in two fields which are contiguous in time, that is, data from the first (4×8block is on odd lines of the (8×8) block and data from the second (4×8) block is on even lines of the (8×8) block.

In the in-field DCT process, the DCT circuit 4 generates coefficient data for an (8×8) block comprising two adjacent, or non-interleaved, (4×8) blocks at the same position in a first field and a second field which are contiguous in time, that is, data from the first (4×8) block is on the first four lines of the (8×8) block and data from the second (4×8) block is on the last four lines of the (8×8) block.

The alternating current components are supplied to a buffer 6, and thence to a quantization circuit 7. The buffer 6 serves to delay the coefficients until their appropriate quantization step size is determined.

The quantization circuit 7 is adapted to quantize coefficient data representing alternating current components of an image block. The quantization circuit 7 is shown in detail in FIG. 12, and is discussed below.

The quantization step is chosen by the estimator 9 to provide the greatest amount of quantized coefficient data that is within a predetermined amount which is based on the capacity of a track of a recording tape. In the present invention, the quantization step for a coefficient is a function of several factors, namely, whether the coefficient represents a still image or an image with motion; the fineness of the pictorial pattern of the image which the coefficient represents, that is, the activity code of the coefficient; the frequency which the coefficient represents, that is, the area number of the coefficient; and whether the coefficient represents luminance or chrominance information.

Since image processing, such as editing, is performed on a field by field or a frame by frame basis, it is useful for the amount of data generated for each field or frame to be equal to or less than a predetermined amount. The amount of data generated in the DCT process and a subsequent variable length code encoding process depends on the pictorial pattern in the image block. It is advantageous for the quantization circuit 7 to control the amount of data corresponding to an image in a unit smaller than one field, referred to herein as a buffering unity so as to simplify the data generation circuit, for example, to allow use of memories of reduced capacity in the circuit. A buffering unit is the same size as a shuffling unit, for example, five macro blocks, each macro block having six coefficient (or DCT) blocks, as shown in FIGS. 1A and 1B.

The quantization circuit 7 is adapted to supply quantized data to a variable length code encoding circuit 11 which serves to perform a run length encoding, Huffman encoding such as two-dimensional Huffman encoding, or another type of encoding for compressing the quantized data. In two-dimensional Huffman encoding, a run length which is a number of consecutive quantized coefficients having value zero, and non-zero coefficient data values are applied to a Huffman table stored in a ROM and thereby a variable length code (encoded output) is generated and supplied to the frame segmentation circuit 13.

Figure 13:
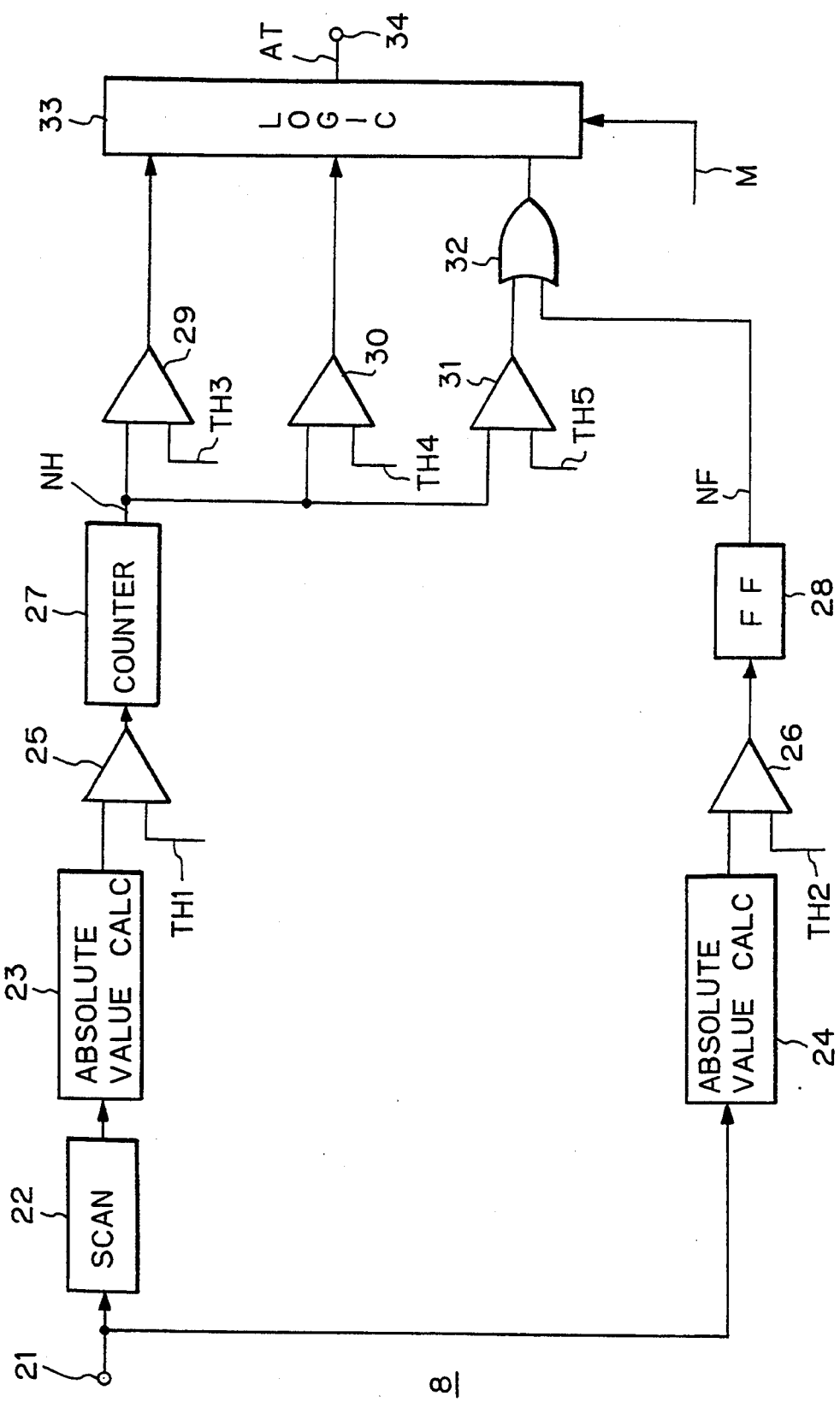
FIG. 13 is a block diagram of an activity detection circuit according to the present invention.
Figure 14:
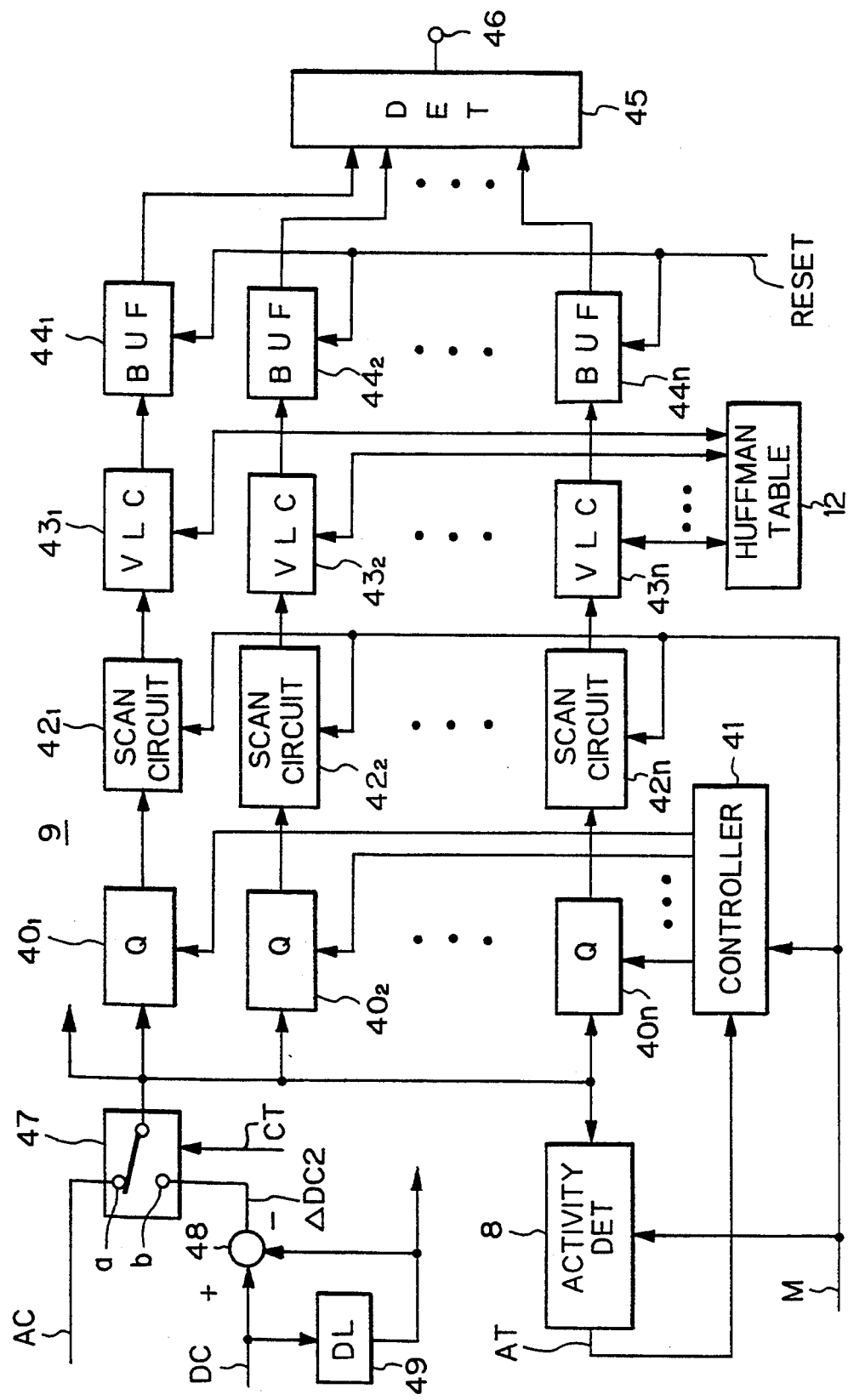
FIG. 14 is a block diagram of an estimator according to the present invention.

The alternating current components of a transformed image data block are also supplied to the activity detection circuit 8 and the estimator 9, shown in FIGS. 13 and 14, respectively.

The activity detection circuit 8 functions to produce an activity code AT based on the fineness of a pictorial pattern in each transformed block. The activity code AT has a length of two bits, representing four activity classes, and is used to reduce the distortion in a reproduced image due to quantization noise. The activity detection circuit 8 also functions to supply the activity code AT to the estimator 9. The estimator 9 serves to supply the activity code AT to the frame segmentation circuit 13.

The estimator 9 is adapted to determine the optimum quantization step sizes for the coefficients in a buffering unit, and to supply a quantization set number QNo identifying these step sizes to both the quantization circuit 7 and the frame segmentation circuit 13. Sixteen sets of quantization step sizes, identified as sets 0 . . . 15, are shown in FIG. 6. The estimator 9 is coupled to a Huffman table 12 which is similar to the Huffman table used in the variable length code encoding circuit 11. The Huffman table 12 serves to generates data representing the number of encoded bits produced by Huffman encoding, whereas the Huffman table used in the circuit 11 serves to generate actual encoded data.

The estimator 9 supplies the quantization set number for the optimum quantization step sizes to the selector 10 that serves to control the quantization circuit 7 to quantize coefficients with the appropriate set of quantization steps, and also serves to supply the quantization set number QNo to the frame segmentation circuit 13.

The frame segmentation circuit 13 is adapted to perform an error correction code encoding process for the above-mentioned data, namely, direct current component data, alternating current component data encoded with variable length code, the quantization number QNo, the motion flag M, and the activity code AT. The frame segmentation circuit 13 is also adapted to convert the data supplied thereto to a frame format, and to generate sync blocks containing the aforementioned data. The sync blocks, having a format shown in FIG. 15 and discussed below, are supplied to two rotary heads (not shown) through a channel code encoding circuit and a record amplifier (also not shown), for recording on a magnetic tape.

The area definition and the change of data sequence performed for a motion block are not shown in FIG. 11 for simplicity.

Figure 12:
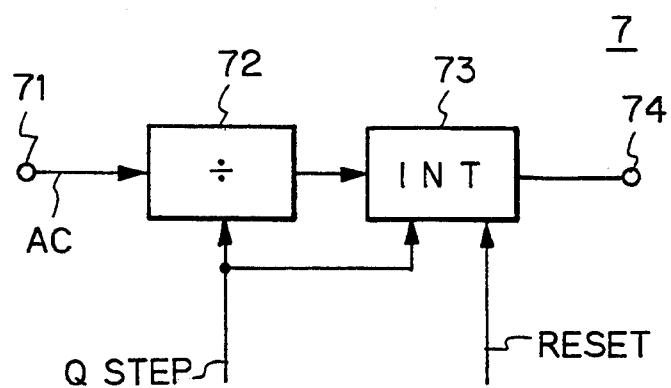
FIG. 12 is a block diagram of a quantization circuit according to the present invention.

FIG. 12 shows an embodiment of a quantization circuit 7 according to the present invention. Alternating current coefficient data is supplied from the buffer 6, shown in FIG. 11, to an input terminal 71 which is coupled to a divider 72. A quantization step is supplied to the divider 72 from the selector 10, shown in FIG. 11. The divider 72 functions to divide each of the alternating current coefficients in a DCT block by a respective quantization step to produce a respective quotient, and further functions to supply that quotient to a truncation circuit 73.

The quantization step is also supplied to the truncation circuit 73. A reset signal is applied to the truncation circuit 73 at the start of each DCT block. The truncation circuit 73 serves to determine the area number of each coefficient based on the number of coefficients supplied since the reset signal, and to truncate the quotient to an integer value, using either the normal midpoint mapping shown in FIG. 7A or, when a coefficient has a high area number and the quantization step is large, the special mapping shown in FIG. 7B in which the quotient of dividing the coefficient by the quantization step is mapped to a lower value when the fractional part of the quotient is less than two-thirds of the quantization step. The quantized coefficient, as truncated to an integer using a normal or a special mapping, is supplied to an output terminal 74.

FIG. 13 shows an embodiment of an activity detection circuit 8 according to the present invention.

An input terminal 21 receives the coefficients representing alternating current components in a DCT block, and supplies them to a scan circuit 22 and an absolute value calculation circuit 24. All coefficients for a block other than its direct current coefficient are supplied to the absolute value calculation circuit 24. In contrast, the scan circuit 22 selects only the high frequency coefficients shown in the shaded region of FIG. 4 and supplies them to an absolute value calculation circuit 23.

The absolute value calculation circuits 23 and 24 convert coefficients into absolute values, and supply these absolute values to comparison circuits 25 and 26, respectively. Threshold values TH1 and TH2, such as 4 and 235, are also supplied to the comparison circuits 25 and 26, respectively.

When the value of a coefficient is TH1 or more, the comparison circuit 25 causes a counter 27 to increment its count value NH. When the value of a coefficient is TH2 or more, the comparison circuit 26 produces a pulse which is latched by a flip-flop 28 and used as a flag NF. The counter 27 and the flip-flop 28 are cleared upon receipt of a DCT block.

The count value NH is applied to comparison circuits 29, 30, and 31, to which threshold values TH3, TH4, and TH5 are supplied, respectively. For example, the values of TH3, TH4, and TH5 may be 1, 5, and 10, respectively. When the count value NH exceeds the threshold value supplied to the comparison circuits 29, 30, and 31, each of these circuits generates respective comparison outputs at a relatively high level. The outputs of the comparison circuits 29 and 30 are supplied to a logic circuit 33. The output of the comparison circuit 31 is supplied to an OR gate 32. The flip-flop 28 supplies the flag NF to the other input of the OR gate 32. The OR gate 32 supplies an output to the logic circuit 33.

The motion flag signal M is supplied to the logic circuit 33. Blocks having motion, as detected by the motion detection circuit 5, are automatically assigned an activity class of 0. The logic circuit 33 functions to generate an activity code AT representing the class of the activity of a DCT block in accordance with Table 1 and the motion flag signal, and to output the activity code AT to an output terminal 34.

FIG. 14 shows an embodiment of an estimator 9 according to the present invention.

Quantization circuits $40_1$ to $40_n$ are adapted to quantize the alternating current coefficients supplied thereto using a respective set of quantization numbers from the quantization sets shown in FIG. 6, in accordance with a control signal from a controller 41, and to supply quantized data to scan circuits $42_1$ to $42_n$. Since there are sixteen quantization sets, n=16 in this embodiment.

The controller 41 may be a programmable microprocessor that is programmed to generate the control signal for the quantization circuits $40_1$ to $40_n$ based on the activity code AT and the motion signal M supplied thereto from the activity detection circuit 8 and the motion detection circuit 5, respectively. As mentioned, the activity detection circuit 8 determines an activity code 0, 1, 2 or 3 for each DCT block. The controller 41 adjusts the quantization step q corresponding to the activity class, in accordance with Table 2. If the adjusted quantization step has a negative value or a value greater than 15, it is clipped to 0 or 15, respectively.

In addition, the controller 41 serves to determine which of eight area numbers is appropriate for a coefficient being quantized, based on its position in the DCT block and the motion flag signal M. Since the sequence of the coefficient data is known, the area definition is based on the temporal sequence in which the coefficients are supplied.

Furthermore, since the luminance signal and the color signals are supplied in a known temporal sequence, the controller 41 further serves to control the area shift process for the color signals.

Each scan circuit $42_1$ to $42_n$ functions to scan the quantized data in a scanning sequence selected in accordance with the motion signal M supplied thereto, and to supply respective scanned data to variable length code encoding circuits $43_1$ to $43_n$. If the motion signal M indicates that the quantized data represent a still image, then the scanning sequence is as shown in FIG. 2, whereas if the quantized data represent an image having motion, the scanning sequence is as shown in FIG. 9.

The variable length code encoding circuits $43_1$ to $43_n$ are each adapted to perform two-dimensional Huffman encoding on the data supplied thereto, using the Huffman table 12 coupled thereto. As mentioned, the Huffman table 12 supplies the number of bits obtained by encoding using the same code as is used by the variable length code encoding circuit 11 to actually encode coefficients. The variable length code encoding circuits $43_1$ to $43_n$ supply respective numbers to buffers $44_1$ to $44_n$ which servo to add the numbers supplied thereto to generate a cumulative total and to supply this cumulative total to a determination circuit 45. Each buffer $44_1$ to $44_n$ is reset after five macro blocks (for example) are received in succession. Thus, each buffer generates a cumulative amount of data which would be obtained for five macro blocks encoded with one of the quantization sets of FIG. 6.

The determination circuit 45 serves to determine which set of quantization numbers corresponds to the greatest amount of encoded data for five macro blocks that is equal to or less than a predetermined value, that is, which set of quantization numbers has the smallest quantization steps that can practically be used. The determination circuit 45 supplies the appropriate quantization set number QNo to the selector 10, shown in FIG. 11, through an output terminal 46.

Coefficients are supplied to the quantization circuits $40_1$ to $40_n$ through a switch circuit 47. Coefficients representing alternating current components of a transformed image block are supplied to an input terminal a of the switch circuit 47 which is controlled by a control signal CT. A subtraction circuit 48 supplies a difference direct current value $\Delta DC2=(DC2-DC1)$, shown in FIG. 8, based on the signals supplied thereto to an input terminal b of the switch circuit 47. A direct current component DC2 of the transformed image block in the present field and a delayed direct current component DC1 of the transformed image block in the previous field are supplied to the subtraction circuit 48. When the in-frame DCT process is performed for a still image block, the terminal a of switch 47 is selected, while, when the in-field DCT process is performed for a block having motion, the terminal b of switch circuit 47 is selected when the difference direct current value ΔDC2 is to be supplied.

FIG. 15 shows a format for a sync block according to the present invention. The length of one sync block is, for example, 90 bytes. At the beginning of the sync block, there is a block synchronous signal SYNC having a length of two bytes, followed by an ID signal comprising two identification bytes, ID0 and ID1, and one parity byte IDP. A data area occupies 77 of the remaining 85 bytes. The last eight bytes of the sync block are parity bytes for an inner code portion of a product code. All sync blocks recorded on a plurality of tracks are sequentially addressed.

The identification bytes ID0 and ID1 contain a frame ID, a format identification bit, a record data type having a length of two bits, a sync block address. The frame ID is inverted whenever a sync block is received. The identification bit identifies the format of the digital VTR according to this embodiment and another format for a data recording apparatus. When the value of the identification bit is "1", it represents the format for the digital VTR. When the value of the identification bit is "0", it represents some other format. The record data identification bit represents the type of record data (such as video and audio). The sync block address contains data of one frame.

At the beginning of the data area in the sync block, there is a quantization number QNo having a length of one byte for identifying the set of quantization step sizes used in compressing the data, followed by an auxiliary code AUX having a length of one byte. The remaining 75 bytes of the data area are either variable length code encoded coefficient data or an outer code portion of a parity product code.

The auxiliary code AUX in the data area is a kind of ID signal. The auxiliary code AUX contains information about the broadcasting system type of a video signal, audio mode, and so forth. The quantization set number QNo and the auxiliary code AUX are recorded in the data area because the error correction code for data in the data area has better error correction performance than the error correction code for the ID signal.

When the data area contains encoded coefficient data, it is divided into an initial area having a length of, for example, three bytes, followed by four areas each having a length of d bytes, for example, d=18. The initial area is used for high frequency components AC-H, and is referred to as a fixed AC-H area. Each area of d bytes is divided into an area of a bytes, for example 12 bytes, and another area of a/2 bytes, for example six bytes. The areas of a bytes are used for the luminance information in a macro block. Two of the areas of a/2 bytes are used for the chrominance information in a macro block, and the other two areas of a/2 bytes are used for the high frequency data in a macro block which exceeded the capacity of the four luminance areas of length a, the two chrominance areas of length a/2, and the initial AC-H area of length three bytes.

At the beginning of each interval of d bytes, in the area of a bytes, there is a luminance direct current component having a length of nine bits and corresponding to one of four luminance DCT blocks of one macro block. The DC component is immediately followed by a motion flag M having a length of one bit and indicating whether or not the DCT block represents motion, and an activity code AT. The remainder of the area of a bytes contains a fixed amount of compressed luminance coefficient data, and is referred to as a Y AC-L area.

In the second and fourth intervals of d bytes, in the area of a/2 bytes, there is a chrominance direct current component having a length of nine bits and corresponding to one of two chrominance DCT blocks U, V of one macro block. The DC component is immediately followed by a motion flag M having a length of one bit and indicating whether or not the DCT block represents motion, and an activity code AT. The remainder of the area of a/2 bytes contains a fixed amount of compressed chrominance coefficient data, and is referred to as a C AC-L area.

In the first and third intervals of d bytes, the area of a/2 bytes is referred to as a fixed AC-H area, and contains the high frequency data in a macro block which exceeded the capacity of the four luminance areas of length a, the two chrominance areas of length a/2, and the initial AC-H area of length three bytes.

When a Y AC-L area or a C AC-L area is not completely filled, it contains a blank area referred to as a variable AC-H area that is used for overflow high frequency coefficient data in a macro block which exceeded the capacity of the fixed AC-H areas.

In another embodiment of the present invention, an interlacing circuit may be included just after the DCT circuit 4 for converting coefficient data obtained in the in-field DCT process into a sequence similar to the interlace scanning process. In this embodiment, subsequent processing can be performed without the necessity of distinguishing between a still image block and a block representing motion. Thus, the control operations and the circuit construction can be simplified.

The above-described embodiment is directed to a digital VTR which records digital video signals on a magnetic tape. However, the present invention can be applied where a medium such as a disc, rather than a tape, is used.

Having described an illustrative embodiment of the present invention with reference to the accompanying drawings, it is to be understood that the invention is not limited to this precise embodiment, and that various changes and modifications may be effected therein by one skilled in the art without departing from the scope or the spirit of the invention as defined in the appended claims.

What is claimed is:

1. An apparatus for processing a digital image signal, comprising:
   block segmentation means for segmenting said digital image signal into blocks of image data;
   orthogonal transform means for orthogonally transforming said blocks of image data into blocks of coefficient data, each transformed block having a direct current coefficient and a plurality of alternating current coefficients;
   quantization means for quantizing each of said alternating current coefficients using a respective selected quantization step to generate quantized data;
   variable length code encoding means for encoding said quantized data;

activity detection means for comparing the higher frequency alternating current coefficients with a plurality of threshold values to generate an activity code for said each transformed block; and control means for obtaining a respective quantization step for said each of said higher frequency alternating current coefficients and for combining said activity code with said respective quantization step to produce said respective selected quantization step.

2. The digital image signal processing apparatus as in claim 1, wherein said control means is operative to obtain an initial quantization step from among a plurality of quantization steps of different size, and to adjust said initial quantization step as a function of said activity code to produce said selected quantization step.

3. An apparatus for processing a digital image signal, comprising:

block segmentation means for segmenting said digital image signal into blocks of image data;

orthogonal transform means for orthogonally transforming said blocks of image data into blocks of coefficient data, each transformed block having a direct current coefficient and a plurality of alternating current coefficients;

quantization means for quantizing each of said alternating current coefficients using a respective selected quantization step to generate quantized data;

variable length code encoding means for encoding said quantized data;

activity detection means for comparing said alternating current coefficients with a plurality of threshold values to generate an activity code for said each transformed block; and control means for generating an area number representing a position of one of said alternating current coefficients in a transformed coefficient data block, for shifting said area number when said one of said alternating current coefficients represents color information, and for determining said respective selected quantization step as a function of said activity code and said area number.

4. An apparatus for processing a digital image signal, comprising:

block segmentation means for segmenting said digital image signal into blocks of image data;

orthogonal transform means for orthogonally transforming said blocks of image data into blocks of coefficient data, each transformed block having a direct current coefficient and a plurality of alternating current coefficients;

quantization means including means for dividing said each of said alternating current coefficients using a respective selected quantization step to produce a quotient, and means for converting said quotient to an integer depending upon whether said respective selected quantization step is larger than a predetermined value to generate quantized data;

variable length code encoding means for encoding said quantized data;

activity detection means for comparing said alternating current coefficients with a plurality of threshold values to generate an activity code for said each transformed block; and control means for selecting said respective selected quantization step in accordance with said activity code.

5. The digital image signal processing apparatus as in claim 4, wherein said means for converting said quotient to an integer is additionally responsive to a position occupied by said each of said alternating current coefficients in a transformed coefficient data block.

6. The digital image signal processing apparatus as in claim 4, wherein said means for converting is operable to map said quotient to a lower value when said quotient has a fractional value less than two-thirds of a value of said selected quantization step.

7. An apparatus for processing a digital image signal, comprising:

block segmentation means for segmenting said digital image signal into blocks of image data;

orthogonal transform means for orthogonally transforming said blocks of image data into blocks of coefficient data, each transformed block having a direct current coefficient and a plurality of alternating current coefficients;

quantization means for quantizing said alternating current coefficients using a selected quantization step to generate quantized data;

variable length code encoding means for encoding said quantized data;

activity detection means including first means for comparing values of each of said alternating current coefficients in a transformed block with a first threshold value to produce a detection flag, second means for comparing values of a predetermined range of alternating current coefficients in said transformed block with additional threshold values to produce a set of comparison results, and means for generating an activity code in accordance with said set of comparison results and said detection flag, said activity code corresponding to high activity when said detection flag indicates that the value of at least one of said alternating current coefficients exceeds said first threshold value; and control means for selecting said selected quantization step in accordance with said activity code.

8. The digital image signal processing apparatus as in claim 7, wherein said control means is operative to obtain an initial quantization step from among a plurality of quantization steps of different size, and to adjust said initial quantization step as a function of said activity code to produce said selected quantization step.

9. The digital image signal processing apparatus as in claim 7, wherein said control means is operative to generate an area number representing a position of one of said alternating current coefficients in a transformed coefficient data block, to shift said area number when said one of said alternating current coefficients represents color information, and to determine said selected quantization step as a function of said activity code and said area number.

10. The digital image signal processing apparatus as in claim 7, wherein said quantization means includes means for dividing each of said alternating current coefficients by a respective said selected quantization step to produce a quotient, and means for converting said quotient to an integer depending upon whether said respective selected quantization step is larger than a predetermined value.

11. The digital image signal processing apparatus as in claim 10, wherein said means for converting said quotient to an integer is additionally responsive to a position occupied by said each of said alternating current coefficients in a transformed coefficient data block.

12. The digital image signal processing apparatus as in claim 10, wherein said means for converting is operable to map said quotient to a lower value when said quotient has a fractional value less than two-thirds of a value of said selected quantization step.

13. A method of processing a digital image signal, comprising the steps of:
  segmenting said digital image signal into blocks of image data;
  orthogonally transforming said blocks of image data into blocks of coefficient data, each transformed block having a direct current coefficient and a plurality of alternating current coefficients;
  quantizing each of said alternating current coefficients using a respective selected quantization step to generate quantized data;
  encoding said quantized data using a variable length code;
  comparing the higher frequency alternating current coefficients with a plurality of threshold values to generate an activity code for said each transformed block;
  obtaining a respective quantization step for said each of said higher frequency alternating current coefficients; and
  combining said activity code with said respective quantization step to produce said respective selected quantization step.

14. The digital image signal processing method as in claim 13, wherein the step of combining includes obtaining an initial quantization step from among a plurality of guantization steps of different size, and adjusting said initial quantization step as a function of said activity code to produce said respective selected quantization step.

15. A method of processing a digital image signal, comprising the steps of:
  segmenting said digital image signal into blocks of image data;
  orthogonally transforming said blocks of image data into blocks of coefficient data, each transformed block having a direct current coefficient and a plurality of alternating current coefficients;
  quantizing each of said alternating current coefficients using a respective selected quantization step to generate quantized data;
  encoding said quantized data using a variable length code;
  comparing said alternating current coefficient with a plurality of threshold values to generate an activity code for said each transformed block; and
  selecting said respective selected quantization step by generating an area number representing a position of one of said alternating current coefficients in a transformed coefficient data block; shifting said area number when said one of said alternating current coefficients represents color information; and determining said respective selected quantization step as a function of said activity code and said area number.

16. A method of processing a digital image signal, comprising the steps of:
  segmenting said digital image signal into blocks of image data;
  orthogonally transforming said blocks of image data into blocks of coefficient data, each transformed block having a direct current coefficient and a plurality of alternating current coefficients;
  quantizing each of said alternating current coefficients by dividing said each of said alternating current coefficients by a respective selected quantization step to produce a quotient, and converting said quotient to an integer depending upon whether said respective selected quantization step is larger than a predetermined value to generate quantized data;
  encoding said quantized data using a variable length code;
  comparing said alternating current coefficients with a plurality of threshold values to generate an activity code for said each transformed block; and
  selecting said respective selected quantization step in accordance with said activity code.

17. A method of processing a digital image signal, comprising the steps of:
  segmenting said digital image signal into blocks of image data;
  orthogonally transforming said blocks of image data into blocks of coefficient data, each transformed block having a direct current coefficient and a plurality of alternating current coefficients;
  quantizing said alternating current coefficients using a selected quantization step to generate quantized data;
  encoding said quantized data using a variable length code;
  comparing values of each of said alternating current coefficients in a transformed block with a first threshold value to produce a detection flag;
  comparing values of a predetermined range of alternating current coefficients in said transformed block with additional threshold values to produce a set of comparison results;
  generating an activity code in accordance with said set of comparison results and said detection flag, said activity code corresponding to high activity when said detection flag indicates that the value of at least one of said alternating current coefficients exceeds said first threshold value; and
  selecting said selected quantization step in accordance with said activity code.

18. The digital image signal processing method as in claim 17, wherein the step of selecting includes obtaining an initial quantization step from among a plurality of quantization steps of different size, and adjusting said initial quantization step as a function of said activity code to produce said selected quantization step.

19. The digital image signal processing method as in claim 17, wherein the step of selecting includes generating an area number representing a position of one of said alternating current coefficients in a transformed coefficient data block; shifting said area number when said one of said alternating current coefficients represents color information; and determining said selected quantization step as a function of said activity code and said area number.

20. The digital image signal processing apparatus as in claim 17, wherein the step of quantizing includes dividing each of said alternating current coefficients by a respective said selected quantization step to produce a quotient, and converting said quotient to an integer depending upon whether said respective selected quantization step is larger than a predetermined value.

* * * * *